US00RE47570E

(19) United States
(12) Reissued Patent
Limb et al.

(10) Patent Number: US RE47,570 E
(45) Date of Reissued Patent: Aug. 13, 2019

(54) STRESSED SUBSTRATES FOR TRANSIENT ELECTRONIC SYSTEMS

(71) Applicant: Palo Alto Research Center Incorporated, Palo Alto, CA (US)

(72) Inventors: Scott J. H. Limb, Palo Alto, CA (US); Gregory L. Whiting, Boulder, CO (US); Sean R. Garner, Redwood City, CA (US); JengPing Lu, Fremont, CA (US); Dirk De Bruyker, San Jose, CA (US)

(73) Assignee: Palo Alto Research Center Incorporated, Palo Alto, CA (US)

(21) Appl. No.: 15/726,944

(22) Filed: Oct. 6, 2017

Related U.S. Patent Documents

Reissue of:

(64) Patent No.: 9,154,138
Issued: Oct. 6, 2015
Appl. No.: 14/052,348
Filed: Oct. 11, 2013

(51) Int. Cl.
*H01L 21/64* (2006.01)
*H01L 21/71* (2006.01)
(Continued)

(52) U.S. Cl.
CPC ..... *H01L 21/71* (2013.01); *H03K 19/17768* (2013.01); *H01L 21/64* (2013.01); *H01L 27/00* (2013.01)

(58) Field of Classification Search
CPC ... H03K 19/17768; H01L 21/64; H01L 21/71; H01L 23/44; H01L 27/00
(Continued)

(56) References Cited

U.S. PATENT DOCUMENTS 3,397,278 A 8/1968 Pomerantz
3,601,114 A 8/1971 Cook
(Continued)

FOREIGN PATENT DOCUMENTS

DE 102004015546 10/2005
WO WO2001043228 6/2001

OTHER PUBLICATIONS

Apr. 13, 2018, File History for U.S. Appl. No. 15/220,221.
(Continued)

*Primary Examiner* — Tuan H Nguyen
(74) *Attorney, Agent, or Firm* — Hollingsworth Davis, LLC

(57) ABSTRACT

A stressed substrate for transient electronic systems (i.e., electronic systems that visually disappear when triggered to do so) that includes one or more stress-engineered layers that store potential energy in the form of a significant internal stress. An associated trigger mechanism is also provided that, when triggered, causes an initial fracture in the stressed substrate, whereby the fracture energy nearly instantaneously travels throughout the stressed substrate, causing the stressed substrate to shatter into multiple small (e.g., micron-sized) pieces that are difficult to detect. The internal stress is incorporated into the stressed substrate through strategies similar to glass tempering (for example through heat or chemical treatment), or by depositing thin-film layers with large amounts of stress. Patterned fracture features are optionally provided to control the final fractured
(Continued)

particle size. Electronic systems built on the substrate are entirely destroyed and dispersed during the transience event.

25 Claims, 7 Drawing Sheets

(51) Int. Cl.
*H01L 23/14* (2006.01)
*H01L 27/00* (2006.01)
*H03K 19/177* (2006.01)

(58) Field of Classification Search
USPC ..... 257/414, 417; 438/130
See application file for complete search history.

(56) References Cited

U.S. PATENT DOCUMENTS 3,666,967 A 5/1972 Keister et al.
3,673,667 A 7/1972 Loewenstein et al.
3,882,323 A 5/1975 Smolker
4,102,664 A 7/1978 Dumbaugh, Jr.
4,139,359 A 2/1979 Johnson et al.
4,598,274 A * 7/1986 Holmes ..... 340/550
4,673,453 A 6/1987 Georgi
5,374,564 A 12/1994 Bruel
7,002,517 B2 2/2006 Nougeim
7,153,758 B2 12/2006 Hata et al.
7,554,085 B2 * 6/2009 Lee ..... 250/338.4
7,880,248 B1 2/2011 Pham et al.
8,130,072 B2 3/2012 De Bruyker et al.
9,154,138 B2 10/2015 Limb et al.
9,294,098 B2 3/2016 Shah et al.
9,356,603 B2 5/2016 Limb et al.
9,577,047 B2 2/2017 Chua et al.
9,630,870 B2 4/2017 Zhao et al.
9,780,044 B2 10/2017 Limb et al.
2004/0031966 A1 2/2004 Forrest
2004/0222500 A1 11/2004 Aspar et al.
2005/0061032 A1 3/2005 Yoshizawa
2005/0084679 A1 4/2005 Sglavo et al.
2005/0176573 A1 8/2005 Thoma et al.
2006/0138798 A1 6/2006 Oehrlein
2006/0270190 A1 11/2006 Nastasi et al.
2007/0113886 A1 5/2007 Arao et al.
2008/0029195 A1 2/2008 Lu
2008/0311686 A1 12/2008 Morral et al.
2009/0086170 A1 4/2009 El-ghoroury et al.
2010/0035038 A1 2/2010 Barefoot et al.
2010/0133641 A1 6/2010 Kim
2010/0225380 A1 9/2010 Hsu et al.
2011/0048756 A1 3/2011 Shi et al.
2011/0089506 A1 * 4/2011 Hoofman ..... G06F 21/87 257/417
2011/0183116 A1 7/2011 Hung et al.
2012/0052252 A1 3/2012 Kohli et al.
2012/0135177 A1 5/2012 Comejo et al.
2012/0135195 A1 5/2012 Glaesemann et al.
2012/0196071 A1 8/2012 Comejo et al.
2012/0288676 A1 11/2012 Sondergard et al.
2013/0037308 A1 2/2013 Wang et al.
2013/0082383 A1 4/2013 Aoya
2013/0140649 A1 * 6/2013 Rogers et al. ..... 257/414
2013/0192305 A1 8/2013 Black et al.
2014/0091374 A1 4/2014 Assefa et al.
2014/0103957 A1 4/2014 Fritz et al.
2014/0266946 A1 9/2014 Billy et al.
2014/0300520 A1 10/2014 Nguyen et al.
2014/0323968 A1 * 10/2014 Rogers et al. ..... 604/113
2015/0001733 A1 1/2015 Karhade et al.
2015/0044445 A1 2/2015 Garner et al.
2015/0076677 A1 3/2015 Ebefors et al.
2015/0089977 A1 4/2015 Li
2015/0102852 A1 4/2015 Limb et al.
2015/0121964 A1 5/2015 Zhao et al.
2015/0229028 A1 8/2015 Billy et al.
2015/0318618 A1 11/2015 Chen et al.
2015/0348940 A1 12/2015 Woychik
2015/0358021 A1 12/2015 Limb et al.
2015/0372389 A1 12/2015 Chen et al.
2016/0122225 A1 5/2016 Wada et al.
2016/0137548 A1 5/2016 Cabral, Jr. et al.
2017/0036942 A1 2/2017 Abramov et al.
2017/0217818 A1 8/2017 Dumenil et al.
2017/0292546 A1 10/2017 Limb et al.
2018/0005963 A1 1/2018 Limb et al.
2018/0033577 A1 2/2018 Whiting et al.
2018/0033742 A1 2/2018 Chua et al.

OTHER PUBLICATIONS

Dec. 6, 2017, Search Report for EP App. No. 17182802.3 dated Dec. 6, 2017, 9 pages.
Apr. 5, 2018, EP Search Report for EP App. No. 17194476.2 dated Apr. 5, 2018, 9 pages.
U.S. Appl. No. 15/299,385, filed Oct. 20, 2016, Chua et al.
U.S. Appl. No. 15/629,506, filed Jun. 21, 2017, Limb et al.
Jan. 4, 2018, EP Search Report dated Jan. 4, 2018 for EP App. No. 17182800.7, 14 pages.
Feb. 13, 2018, File History for EP App. No. 17163445.4 as retrieved from the EP Patent Office electronic file system on Feb. 13, 2018, 74 pages.
Feb. 13, 2018, File History for U.S. Appl. No. 14/796,440.
Feb. 13, 2018, File History for U.S. Appl. No. 15/220,221.
Feb. 13, 2018, File History for U.S. Appl. No. 15/220,164.
Feb. 14, 2018, File History for U.S. Appl. No. 15/629,506.
Feb. 13, 2018, File History for U.S. Appl. No. 15/092,313.
File History for U.S. Appl. No. 15/092,313.
File History for U.S. Appl. No. 15/220,164.
File History for U.S. Appl. No. 15/220,221.
File History for U.S. Appl. No. 15/629,506.
File History for U.S. Appl. No. 15/689,566.
File History for U.S. Appl. No. 16/025,573.
File History for U.S. Appl. No. 16/033,783.

* cited by examiner

STRESSED SUBSTRATES FOR TRANSIENT ELECTRONIC SYSTEMS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*STATEMENT REGARDING FEDERALLY SPONSORED RESEARCH AND DEVELOPMENT*

*This invention was made with Government support under Contract No. HR0011-14-C-0013 (G017.3765) awarded by defense Advanced Research Projects Agency. The Government has certain rights in this invention.*

*This is an application for reissue of U.S. Pat. No. 9,154,138.*

FIELD OF THE INVENTION

This invention relates to transient electronic systems, and in particular to substrates used in transient electronic systems.

BACKGROUND OF THE INVENTION

Large area sensing is critical for a variety of military, ecological and commercial interests and has historically been served through the use of centralized long-range sensors. However, rapid improvements in miniaturization of electronic systems have significantly improved the capabilities of small sensor devices. These micro-sensors have the potential to create "large N" distributed networks with advantages in operational adaptability, non-traditional sensing modalities that are only possible with close proximity, increased sensitivity and knowledge extraction through networked intelligence.

While distributed network systems have remarkable promise, their realistic use is limited by risks associated with their accumulation in the environment, detection and defeat, and exploitation due to inability to maintain positive control (unlike centralized long-range sensors).

The phrase "transient electronics" refers to a relatively new family of electronic devices that disappear (disaggregate and disperse) within a set period of time, making them ideally suited for distributed network systems. Conventional transient electronic systems typically rely on the use of soluble substrates and electronic materials (such as silk). When placed into solvent (typically water), these conventional substrates and electronics slowly dissolve into solution. As such, a distributed network system made up of conventional transient electronic devices can be expected to "disappear" over a relatively short amount of time (e.g., after periodic rainfall).

Although the conventional transient electronic approaches achieve the goal of causing the electronics to "disappear" after use, the long dissolution period required to achieve complete disaggregation and dispersal make the conventional approaches unfit for discrete (e.g., military) applications that require rapid and complete disaggregation upon command. Moreover, the conventional approaches utilize materials that are not compatible with existing integrated circuit fabrication and assembly techniques, requiring the development of new IC fabrication processes at significant cost.

What is needed is a substrate for transient electronics that is compatible with existing IC fabrication techniques, and achieves complete, on-command disaggregation of the electronic circuitry formed thereon.

SUMMARY OF THE INVENTION

The present invention is directed to a stressed substrate for transient electronic systems that utilizes one or more stress-engineered layers to store potential energy in the form of residual, self-equilibrating internal stresses, and an associated transient event triggering mechanism that, upon receiving a trigger signal, generates an initial fracture that causes the stressed substrate to suddenly and catastrophically release the stored potential energy in a manner that completely disaggregates ("powderizes") the stressed substrate into micron-sized particulates (i.e., 100 μm across) using a mechanism similar to that captured in a Prince Rupert's Drop. The stressed substrate is stable enough to support either mounted or fabricated electronics thereon. In one embodiment, the stressed substrate comprises a suitable semiconductor material (e.g., $SiO_2$) that is compatible with existing IC fabrication techniques. The stress-engineered layers include at least one tensile layer and at least one compressive layer that are operably attached together such that release of the potential energy powderizes the stressed substrate and any electronic devices disposed thereon. The transient event triggering system is connected to the stressed substrate, and includes an actuating mechanism that controls release of the potential energy, i.e., by generating an initial fracture in the stressed substrate upon receipt of a trigger signal (e.g., an externally delivered current pulse or a radio frequency signal). The present invention thus facilitates the production of transient electronic systems that reliably disappear (powderize) in a significantly shorter amount of time than is possible using conventional (e.g., soluble substrate) approaches. Moreover, because the stressed substrate is compatible with low-cost existing IC fabrication techniques, the present invention facilitates the production of transient electronic systems having custom-fabricated IC devices and/or the incorporation of high-performance off-the-shelf electronic devices with minimal (or potentially without any) modification to core IC fabrication process.

According to alternative exemplary embodiments, stressed substrates are fabricated either by depositing stress-engineered substrate layers using, for example, plasma vapor deposition techniques in which the deposition parameters (i.e., temperature or pressure) are varied such that the layers collectively contain a significant inbuilt stress gradient, or by post-treating the substrate material using strategies similar to glass tempering (e.g., by way of ion-exchange, heat or chemical treatment). In some cases, the stress-engineered substrate layers are sequentially deposited on top of each other inside a sacrificial mold that is later removed (i.e., such that the stressed substrate is entirely formed by the deposited stress-engineered substrate layers). In other cases, the stress-engineered layers are formed over a central core substrate. In each case, the stressed substrate includes at least one tensile stress layer having a residual tensile stress and at least one compressive stress layer having a residual compressive stress, where the compressive stress layer is operably integrally connected to the tensile stress layer such that residual tensile and compressive stresses are self-equilibrating (i.e., such that the laminated structure is stable), and such that the residual tensile and compressive stresses are sufficient to cause complete powderization of the substrate upon application of a triggering force (i.e., an initial fracture) by way of a suitable trigger mechanism (e.g., one of a resistive heat element, a chemical reaction element, and a mechanical pressure element).

According to an aspect of the present invention, transient electronic systems are fabricated by forming a stressed substrate using the methods mentioned above, and then disposing (i.e., fabricating or mounting) one or more electronic elements and one or more trigger mechanisms on the stressed substrate. According to alternative embodiments, the electronic devices are attached to the stressed substrate using various techniques. In one exemplary embodiment, already-formed microelectronic circuit "chips" are attached to the substrate using a bonding method (such as using sealing glasses or anodic bonding) that allows crack propagation to destroy the adhered chips. That is, during the transience event, not only will the substrate fracture into small difficult to detect particles, but the bonded microelectronic devices will also fracture into small particulates as well. The final particle size after triggering is based upon factors such as the stress profile and substrate thickness. In one embodiment, the IC chip is thinned and/or patterned to provide fracture points (features) that assist in controlling the final fractured particle size (i.e., the fracture features are formed such that, when the substrate is powderized by release of the stored potential energy, the substrate fractures along the patterned fracture features. In another embodiment, standard thin-film fabrication (e.g., photolithographic or inkjet printing) techniques are used to fabricate the electronic devices directly into and/or on the stressed substrate such that, upon triggering, the energy released by the stressed substrate destroys the thin, brittle functional layers and all electronics formed thereon.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in transient electronic devices. The following description is presented to enable one of ordinary skill in the art to make and use the invention as provided in the context of a particular application and its requirements. As used herein, directional terms such as "upper", "upward", "lower", "downward", are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
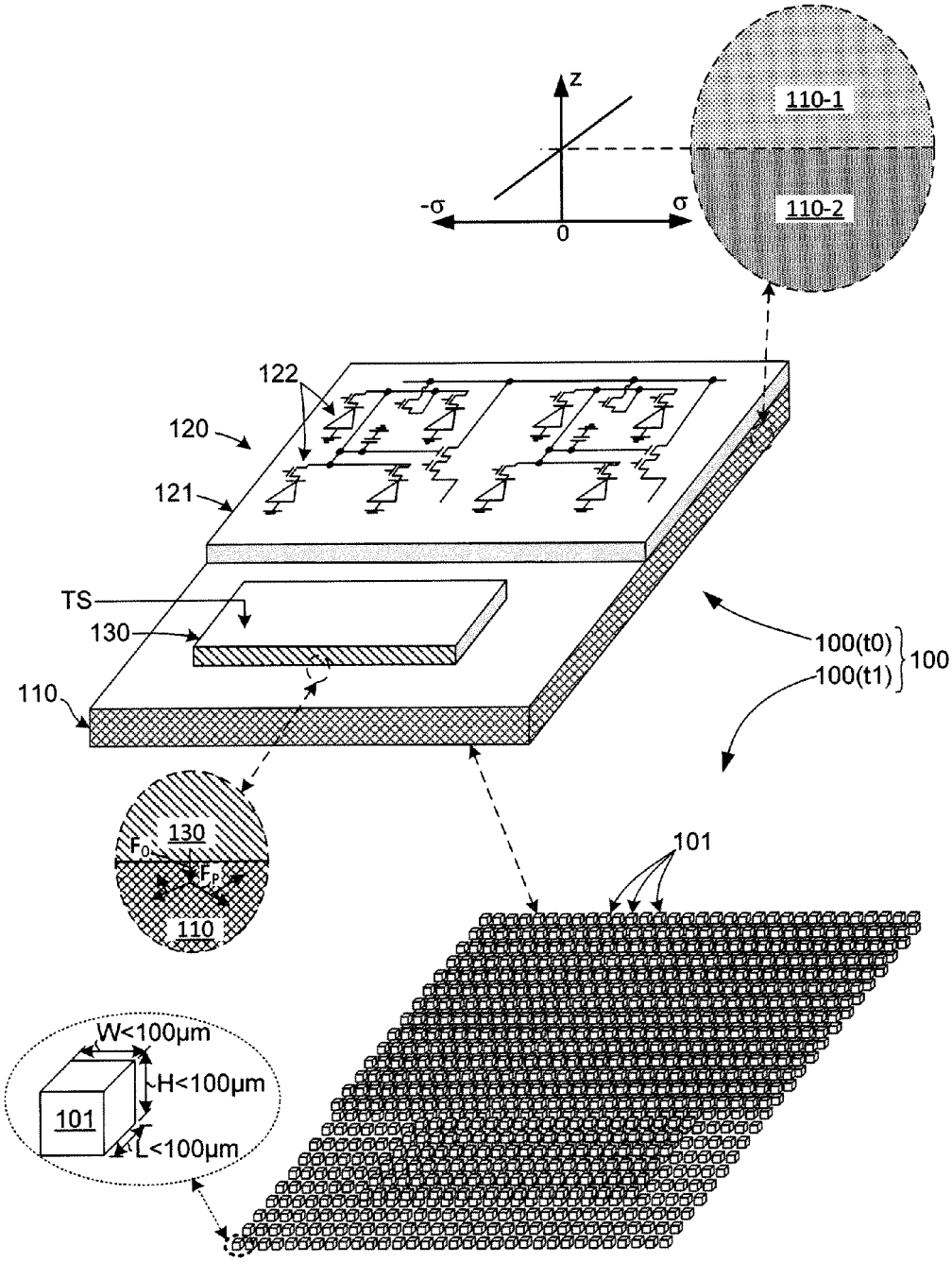
FIG. 1 is a top side perspective view showing a transient electronic device produced in accordance with an exemplary embodiment of the present invention.

FIG. 1 is a simplified diagram including perspective views showing a transient electronic device 100 in a pre-transience "whole" state (i.e., device 100(t0) shown in the middle portion of FIG. 1) and a post-transience "powderized" state (i.e., device 100(t1) shown in the lower portion of FIG. 1). Referring to the middle of FIG. 1, in the pre-transience state (e.g., immediately after production), transient electronic device 100(t0) generally includes an integrated circuit (functional) layer 120 and a trigger mechanism 130 that are disposed on a stressed substrate 110, which is characterized as shown in the bubble at the upper portion of FIG. 1. Functional layer 120 of device 100(t0) includes one or more electronic elements 122 that perform a prescribed useful function (e.g., sensor operations) up until the transient event. As described in additional detail below, trigger mechanism 130 initiates the transient event, e.g., by generating an initial fracture $F_0$ (shown in the bubble immediately below device 100(t0)). As depicted by device 100 (t1), the initial fracture propagates through stressed substrate 110 and the associated structures, causing the device to undergo powderization (i.e., fragmentation into tiny particles 101, one of which is depicted in the bubble located in the lowermost portion of FIG. 1).

Referring to device 100(t0) and to the bubble located in the uppermost portion of FIG. 1, stressed substrate 110 is a wafer-like structure including at least one tensile stress layer 110-1 having a residual tensile stress and at least one compressive stress layer 110-2 having a residual compressive stress. Tensile stress layer 110-1 and compressive stress layer 110-2 (collectively referred to herein as "stress-engineered layers) are operably integrally connected together such that residual tensile and compressive stresses are self-equilibrating and produce a stress gradient (e.g., indicated by the simplified stress graph shown at the right of the bubble). As set forth in additional detail below, the stress-engineered layers 110-1 and 110-2 are fabricated either by post-treating a substrate material using strategies similar to glass tempering (e.g., by way of heat or chemical treatment), or by depositing the substrate layers using, for example chemical, vapor deposition techniques in which the deposition parameters (i.e., temperature, pressure, chemistry) are varied such that the layers collectively contain a significant inbuilt stress gradient. Note that the arrangement of stress-engineered layers 110-1 and 110-2 indicated in the upper bubble is not intended to be limiting in that one or more non-stressed substrate layers may be disposed between the two stress-engineered layers, and in that the stress gradient is not necessarily linear.

Referring to the middle of FIG. 1, functional layer 120 includes a suitable base layer 121 preferably formed using a semiconductor material (e.g., $SiO_2$) that is compatible with existing IC fabrication techniques, and one or more electronic elements 122 that are fabricated on and in base layer 121 that perform one or more designated (e.g., sensor) operations. As described in additional detail below, functional layer 120 is operably attached to the stressed substrate 110 such that release of the potential energy powderizes both stressed substrate 110 and functional layer 120, along with any electronic devices disposed thereon.

Referring to the lower-middle portion of FIG. 1, trigger mechanism 130 serves to initiate a transient event that controls the release of potential energy stored in stressed substrate 110 in response to a suitable trigger signal TS (e.g., an externally delivered current pulse or a radio frequency signal). As indicated in the middle bubble of FIG. 1, trigger mechanism 130 is disposed on substrate 110 and constructed such that the transient event is initiated, for example, by generating an initial fracture $F_0$. As indicated in the middle bubble, this initial fracture $F_0$ is propagated by way of secondary fractures $F_P$ that travel rapidly throughout stressed substrate 110, whereby the potential energy stored in stressed substrate 110 is suddenly and catastrophically released in a manner that completely disaggregates (powderizes) the stressed substrate into micron-sized particulates 101 (i.e., having length L, width W, and height H dimensions that are less than approximately 100 μm across, as illustrated in the bubble located at the bottom of FIG. 1).

According to an aspect of the present invention, the mechanism by which transient device 100 is powderized during the above-described transient event is similar to that associated with a Prince Rupert's Drop. A Prince Rupert's Drop is formed by simply dropping a bead of molten glass into water, cooling the surface of the drop much more rapidly than the bulk during solidification. This leads to compressive stress on the surface of the glass and tensile stress within the bulk. The resulting glass is very strong as the surface stress resists cracking, however the tail is thin enough that it can be broken; when this is done the elastic strain energy within the drop is released rapidly (fracture propagation steeps are $>1000\ ms^{-1}$) and the drop is shattered into powder. The disaggregation of stressed substrate 110 in response to a transient event trigger signal TS is similar to that of a Prince Rupert's Drop, and hence the terms "powderize" and "powderization" are defined herein to describe a disaggregation event similar to that associated with a Prince Rupert's Drop.

Referring to the lower portion of FIG. 1, by utilizing suitable device fabrication techniques and trigger mechanisms (some of which are described below), the above-mentioned transient event facilitates the controlled nearly instantaneous powderization of the entirety of device 100 (t1) (i.e., functional layer 120) into particles of 100 μm or smaller that are not discernible by the human eye at greater than 50 cm viewing distance. That is, by storing sufficient potential energy in stressed substrate 110 to powderize functional layer 120, and by providing trigger mechanism 130 for releasing the potential energy on command, the present invention facilitates the production of transient electronic devices 100 that reliably essentially disappear on command and in a significantly shorter amount of time than is possible using conventional (e.g., soluble substrate) approaches. Moreover, because stressed substrate 110 is compatible with low-cost existing IC fabrication techniques, the present invention facilitates the production of transient electronic systems having custom-fabricated IC devices and/or the incorporation of high-performance off-the-shelf electronic devices with minimal (or potentially without any) modification to core IC fabrication process.

Various methods may be used to generate stressed substrate 110 utilized in transient electronic device 100 (shown in FIG. 1). A first approach to forming stressed substrates involves thin film sputter deposition. In thin film sputter deposition, generally two distinct regimes can be identified leading to very different film morphology and characteristics, and result in either compressive or tensile stress. Metals are often used because of functionality (e.g., electrical properties), their structural qualities (e.g., ductility), and the fact that a conductive sputter target allows for a simple, high yield, glow discharge DC magnetron sputtering process. However, stress-engineered metal oxides and glasses (silicon oxides) can be sputtered as well; these insulating or semiconducting films can be sputter deposited by either radiofrequency (RF) sputtering or by reactive sputtering in a mixed inert/reactive gas plasma (e.g. argon/oxygen). The assignee of the present invention has generated films of stress engineered vanadium oxide using the latter method, for use as temperature sensitive micro-probes. In addition, relatively thick oxide films have been sputter deposited and stress engineered in order to minimize intrinsic stress.

To achieve reliable powderization yielding fragmentation particulates ≤100 μm in any lateral dimension, the presently preferred methodology for generating stressed substrates involves adapting stress-engineered thin film fabrication techniques with ion-exchange tempering to create optimal stress profiles in glass ($SiO_2$) substrates. The presently preferred stressed substrate fabrication methodologies are set forth in the exemplary embodiments described below with reference to FIGS. 2(A) to 2(E), 3(A) to 3(E), and 4(A) to 4(E).

Figure 2A:
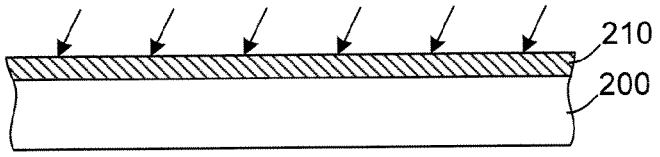
FIGS. 2(A), 2(B), 2(C), 2(D) and 2(E) are simplified cross-sectional side views showing the production of a stressed substrate according to an embodiment of the present invention.
Figure 2B:
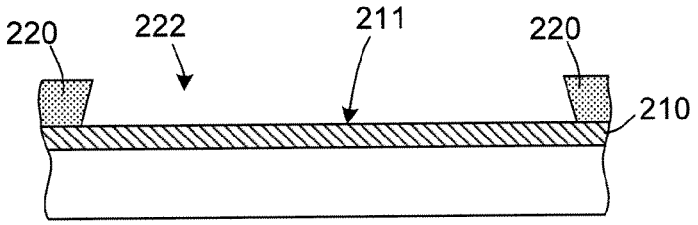
Figure 2C:
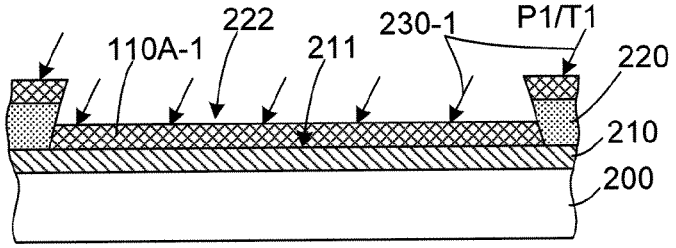
Figure 2D:
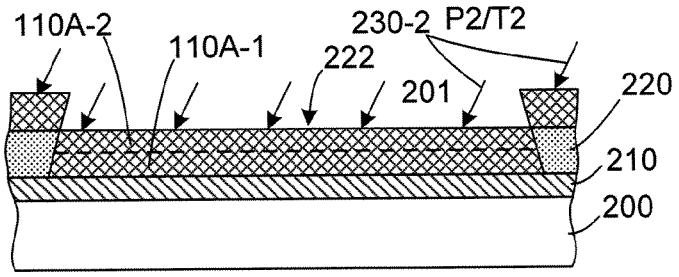
Figure 2E:
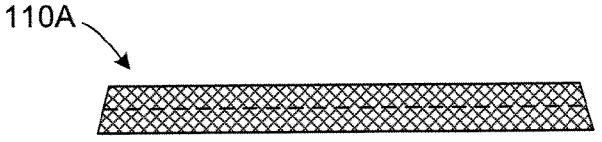

FIGS. 2(A) to 2(E) illustrate a first methodology in which a stressed substrate 110A is built up by patterned $SiO_2$ stressed substrates generated entirely using plasma vapor deposition (PVD) techniques. This methodology provides a high degree of control over the specific stress profile generated in the stressed substrate, and introduces a completely new way to create tempered glass, with continuous control over glass formulation and morphology through the thickness dimension of the stressed substrate. Referring to FIG. 2(A), a wafer 200 (e.g., silicon or other material) is coated with a release layer 210, most likely a metal. In FIG. 2(B), a thick liftoff mask 220 is then patterned on release layer 210 such that mask 220 defines an opening 222. Note that wafer 200, release layer 210 and mask 220 form a sacrificial structure. Referring to FIGS. 2(C) and 2(D), PVD processing is then used to create the stress engineered layers 110A-1 and 110A-2 in opening 222, placing stresses in the deposited substrate material 230-1 and 230-2, for example, by altering the process parameters (e.g., using different temperatures T1 and T2 and/or pressures P1 and P2). Finally, as indicated in FIG. 2(E), the mask is then lifted off, and stressed substrate 110A is singulated (removed) from the remaining sacrificial structure by underetching the release layer.

Figure 3A:
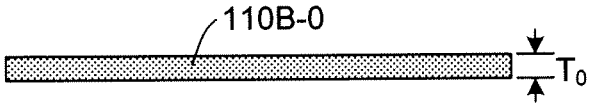
FIGS. 3(A), 3(B), 3(C), 3(D) and 3(E) are simplified cross-sectional side views showing the production of a stressed substrate according to another embodiment of the present invention.
Figure 3B:
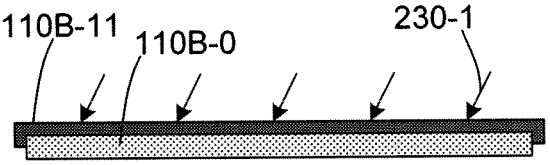
Figure 3C:
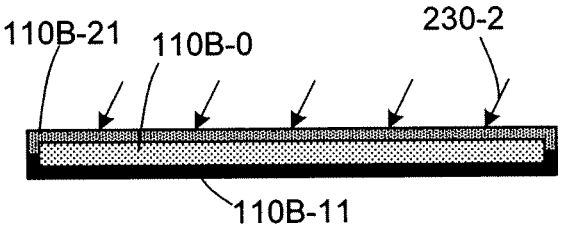
Figure 3D:
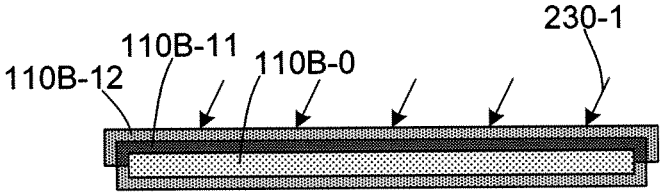
Figure 3E:
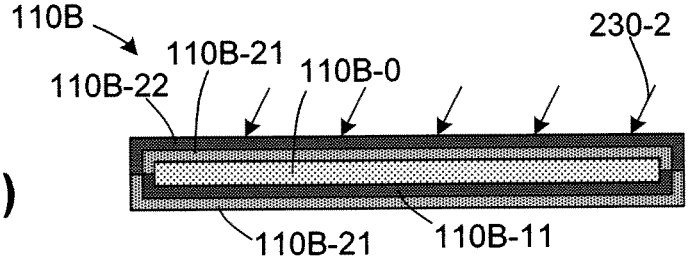

FIGS. 3(A) to 3(E) illustrate a second methodology in which a stressed substrate 110B is built up by patterned $SiO_2$ on a thin glass core using PVD techniques. This methodology avoids a possible drawback to the first methodology (i.e., that the thick PVD processing proves unreliable), but in a similar manner provides a high degree of control over the specific stress profile generated in the stressed substrate. Referring to FIG. 3(A), the process begins using a substantially unstressed glass core substrate 110B-0 having a thickness $T_0$ in the range of 25 μm and 100 μm. Suitable glass core substrates are currently produced by Schott North America, Inc. of Elmsford, N.Y., USA). Referring to FIGS. 3(B) to 3(E), $SiO_2$ is then deposited on alternating sides of core substrate 110B-0 via PVD using methods similar to those described above. Specifically, FIG. 3(B) shows the deposition of material 230-1 in a manner that forms stress-engineered layer 110B-11 on core substrate 110B-0. FIG. 3(C) shows the deposition of material 230-2 in a manner that forms stress-engineered layer 110B-21 on an opposite side of core substrate 110B-0. FIG. 3(C) shows the subsequent deposition of material 230-1 in a manner that forms stress-engineered layer 110B-12 on core layer 110B-11, and FIG. 3(E) shows the deposition of material 230-2 in a manner that forms stress-engineered layer 110B-22 layer 110B-21. FIG. 3(E) shows completed stressed substrate 110B including core substrate (central, substantially unstressed layer) 110B-0 with stress-engineered layers 110B-11, 110B-12, 110B-21 and 110B-22 formed thereon. A possible drawback to this methodology is that, because core substrate 110B-0 is freestanding and the deposited stress-engineered layers have high stress, each stress-engineered layer must be made thin enough that no de-bonding or cracking occurs, and that core substrate 110B-0 is not caused to flex excessively. One possible approach will be to construct a custom fixture that can rotate the samples inside the deposition chamber during PVD. Another possible challenge will be developing suitable surface preparation and deposition process parameters so that good film adhesion is achieved.

Figure 4A:
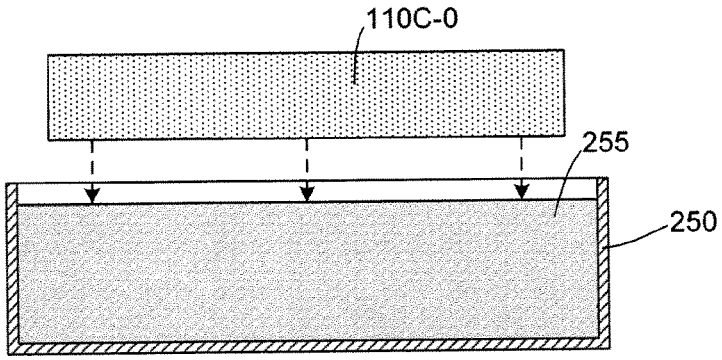
FIGS. 4(A), 4(B), 4(C), 4(D) and 4(E) are simplified cross-sectional side views showing the production of a stressed substrate according to another embodiment of the present invention.
Figure 4B:
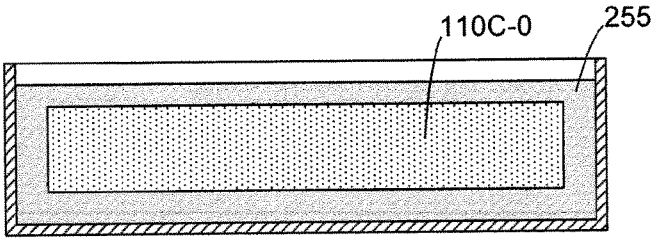
Figure 4C:
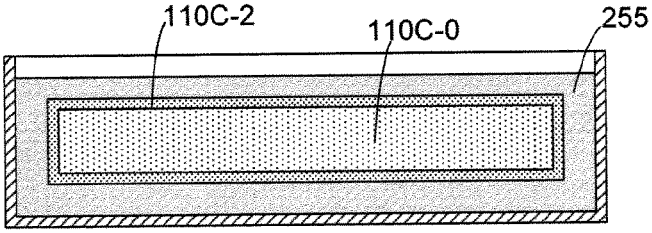
Figure 4D:
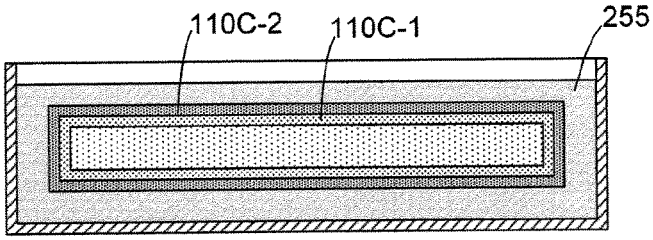
Figure 4E:
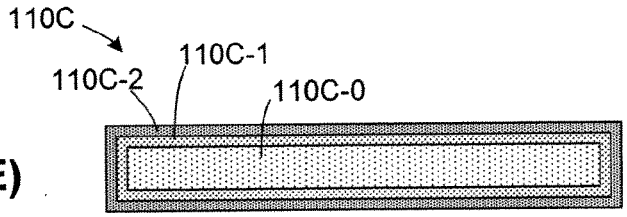

FIGS. 4(A) to 4(E) illustrate a third methodology in which a stressed substrate 110C is produced by subjecting a core substrate to one of an ion-exchange tempering treatment, a chemical treatment and a thermal treatment. Specifically, FIGS. 4(A) to 4(E) illustrate an exemplary ion-exchange tempering treatment during which various stress profiles are introduced in a core substrate via molten-salt ion exchange. FIG. 4(A) shows a core substrate 110C-0 over a vat 250 containing a molten-salt solution 255. FIG. 4(B) shows core substrate 1100-0 immediately after submersion in molten-salt solution 255, FIG. 4(C) shows core substrate 110C-0 after a first time period of submersion in molten-salt solution 255 in which a first stress-engineered layer 110C-1 is formed, and FIG. 4(D) shows the structure after a second time period of submersion in molten-salt solution 255 in which a second stress-engineered layer 110C-2 is formed on first stress-engineered layer 110C-1. FIG. 4(E) shows completed stressed substrate 1000 including central core substrate 110C-0 and stress-engineered layers 110C-1 and 110C-2.

According to a fourth methodology, a hybrid of the above second and third methods is employed in which diced, thin glass core substrates are ion-exchange tempered, and then multiple layers of $SiO_2$ are deposited on the tempered substrates to further increase the induced stresses. This combined approach has the advantage that much higher central tension values should be attainable by varying the parameters of the ion exchange or the thickness of the layering materials and their relative stress mismatch.

FIGS. 5(A) to 5(F) depict the fabrication and subsequent actuation of a transient electronic device 100D according to another embodiment of the present invention.

Figure 5A:
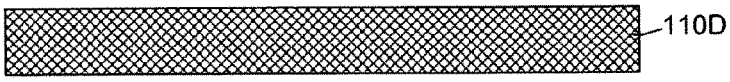
FIGS. 5(A), 5(B), 5(C), 5(D), 5(E), 5(F) and 5(G) are cross-sectional side views showing a transient electronic device produced in accordance with another embodiment of the present invention.

FIG. 5(A) depicts a stressed substrate 110D produced in accordance with any of the methodologies mentioned above.

Figure 5B:
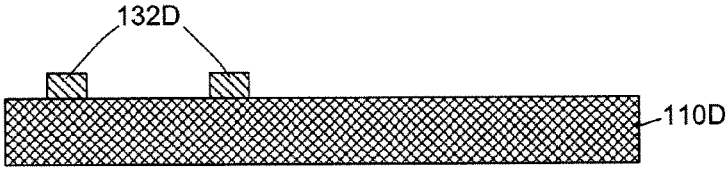
Figure 5C:
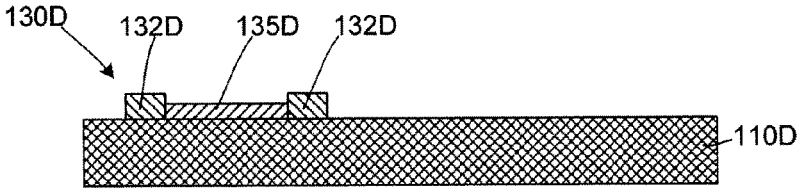

FIGS. 5(B) and 5(C) depict the formation of a trigger mechanism 130D on stressed substrate 110D according to a currently preferred embodiment. Trigger mechanism 130D is electrical, and more specifically utilizes a heating element to generate local heating in response to an applied electrical pulse. As indicated in these figures, trigger mechanism 130D is constructed by forming a wide/thicker lower resistance electrodes 132D (shown in FIG. 5(B)), and then forming a resistive, thin, narrow resistor structure 135D (shown in FIG. 5(C)) between electrodes 132D, where resistor structure 135D is formed using a material that is capable of sustaining high temperature (e.g., a mental such as tungsten). Trigger mechanism 130D is fabricated directly onto stressed substrate 110D using standard microfacrication techniques (vapor deposition and photo-patterning) or simply through shadow-masked evaporation. The mechanism of fracture generated by trigger mechanism 130D is hoop stress generated as the portion of stressed substrate 110D heated by resistor structure 135D expands. Simulation of such triggering mechanisms indicate that 0.5 ms after the current pulse is applied, tensile hoop stresses in the range of 100-150 MPa are present below the resistor structure—this would be sufficient to initiate fracture in almost any traditionally tempered glass. These simulation results show that large surface tensile stresses can be obtained with a modest amount of current and energy. In this example, based on resistance estimates using properties for tungsten, the current is approximately 70 mA, and the voltage developed across the resistor is about 80 mV. These amounts are well within the capabilities of currently available small-form-factor batteries.

Figure 5D:
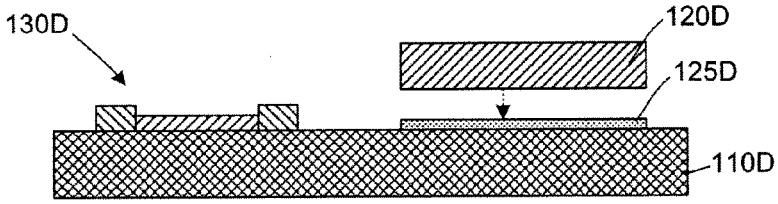

FIG. 5(D) depicts the disposition of an IC device 120D on stressed substrate 110D according to a currently preferred embodiment. The preferred circuit proxy is a bare single-crystal silicon chip, thinned via CMP to realistic thicknesses. The inventors do not believe that the lack of CMOS processing layers changes the mechanical properties of the proxy chip significantly compared to actual chips. The key to achieving fragmentation of this type of chip is coupling the propagating cracks from stressed substrate 110D into the silicon of IC chip 120D. This process can be viewed as a competition between two possible outcomes: a crack can propagate upward into the silicon, or make a sharp turn and instead propagate through the bond region, leading to de-bonding. To exceed the ratio needed for a glass/silicon bond, a low-melting-point sealing glass 125D is utilized to secure IC 120D to stressed substrate 110D. Alternatively, an anodic, eutectic and adhesive bonding is used to secure IC 120D to stressed substrate 110D.

Figure 5E:
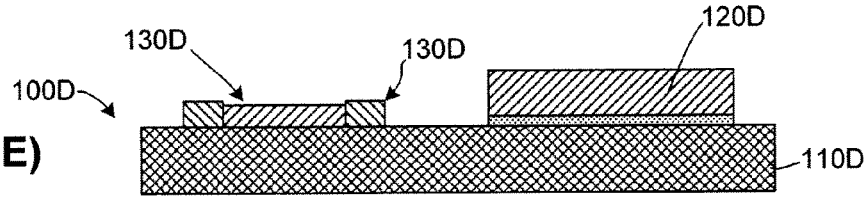
Figure 5F:
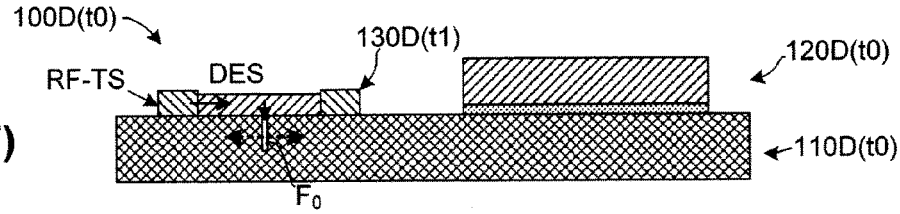
Figure 5G:
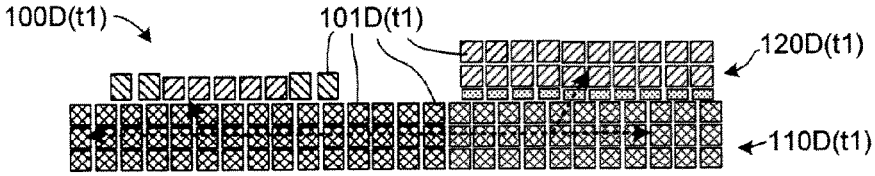

FIGS. 5(E) to 5(G) illustrate the subsequent completion and actuation of transient electronic device 100D. FIG. 5(E) depicts completed device 100D formed by stressed substrate 110D, IC chip (functional substrate or layer) 120D, and triggering mechanism 130D. FIGS. 5(F) and 5(G) show the subsequent controlled destruction (disaggregation) of device 100D, with FIG. 5(F) depicting device 100D(t0) during the transmission of a radio-frequency trigger signal RF-TS to triggering mechanism 130D, which in turn generates an initial fracture $F_0$ in stressed substrate 110E by way of localized heating, and FIG. 5(G) depicting the subsequent powderized device 100D(t1) caused by the propagation of fractures throughout the various structures, thereby forming particles 101E(t1).

In addition to the localized heating approach described in the previous embodiment, other trigger mechanisms may be utilized to generate the initial fracture required to generate powderization of the stressed substrate. For example, suitable triggering mechanisms may be produced that generate localized fracturing using by initiating a chemical reaction on the surface of the stressed substrate, or by applying a localized mechanical pressure (e.g., using a piezoelectric element) to the stressed stressed substrate.

FIGS. 6(A) to 6(G) depict the fabrication and actuation of a transient electronic device 100E according to another embodiment of the present invention in which defects sites are created to promote fracturing.

Figure 6A:
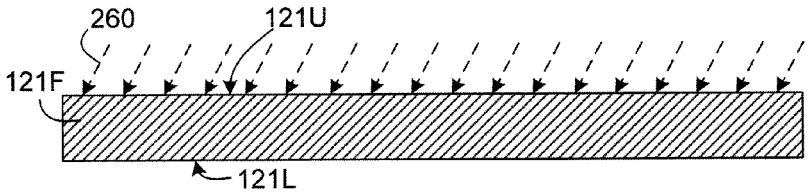
FIGS. 6(A), 6(B), 6(C), 6(D), 6(E), 6(F) and 6(G) are cross-sectional side views showing a transient electronic device produced in accordance with another embodiment of the present invention.
Figure 6B:
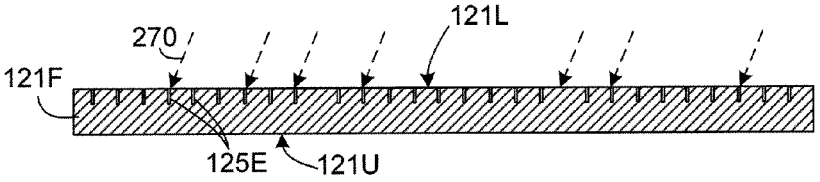
Figure 6C:
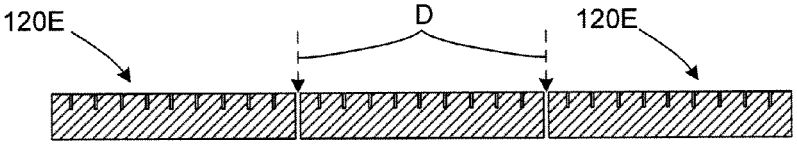

FIGS. 6(A) to 6(C) depict the generation of IC chips 120E having the requisite facture features. FIG. 6(A) depicts a "normal" semiconductor (e.g., monocrystalline silicon) functional substrate 121F during an established low-cost, high-volume (e.g., CMOS) fabrication process in which electronic elements are produced on upper surface 121F. FIG. 6(B) depicts functional substrate 121E after lower surface 121L is subject to polishing (i.e., to reduce the substrate thickness), and the generation of patterned fracture features 125E by laser beams 260 directed onto lower surface 121L from a laser ablation tool using known laser-scoring techniques. Alternatively, a process similar to "stealth dicing" technology developed by Hamamatsu Photonics K.K. of Japan may be used, in which a laser focus internal to the silicon creates defects which promote cracking. FIG. 6(C) shows subsequent dicing cuts D applied to segment the wafer into individual IC die 120E.

Figure 6D:
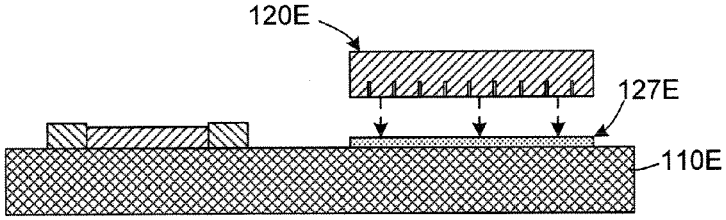
Figure 6E:
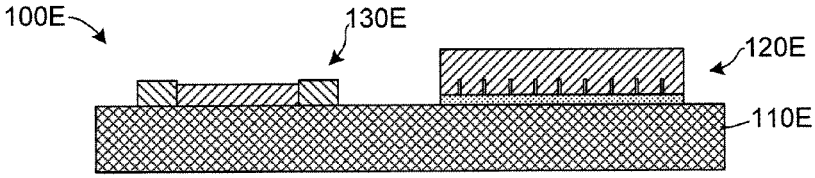
Figure 6F:
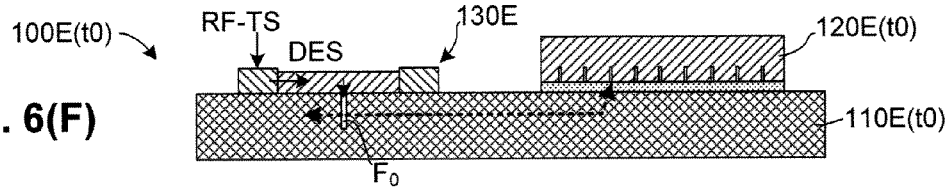
Figure 6G:
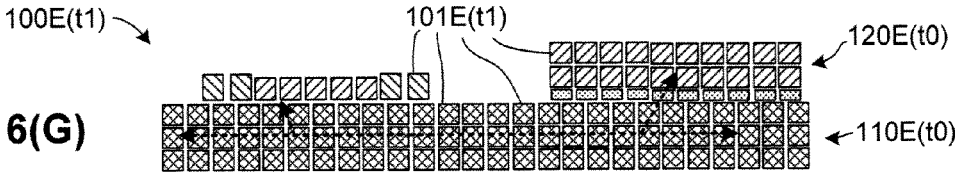

FIGS. 6(D) to 6(G) illustrate the subsequent completion of transient electronic device 100E using IC die 120E. FIG. 6(D) depicts mounting IC die (functional substrate) 120E on stressed substrate 110E, which is produced in accordance with any of the methodologies mentioned above, by way of a sealing glass 127E (or an anodic bond) in the manner described above. FIG. 6(E) depicts completed device 100E formed by stressed substrate 110E, IC chip (functional substrate or layer) 120E, and a triggering mechanism 130E formed in accordance with any of the embodiments mentioned above. FIGS. 6(F) and 6(G) show the subsequent controlled destruction (disaggregation) of device 100E, with FIG. 6(F) depicting device 100E(t0) during the transmission of trigger signal RF-TS to triggering mechanism 130E, which in turn generates an initial fracture $F_0$ in stressed substrate 110E according to one of the mechanisms mentioned above, and FIG. 6(G) depicting the subsequent powderized device 100E(t1) caused by the propagation of fractures throughout the various structures, thereby forming particles 101E(t1). The resulting patterned fracture features (grooves) 125E should have a much higher defect density than the base polished silicon, so cracks are expected to readily form at these features, whereby fragmentation (i.e., the size of particles 101E(t1)) is controlled through the spacing of these defects.

Figure 7A:
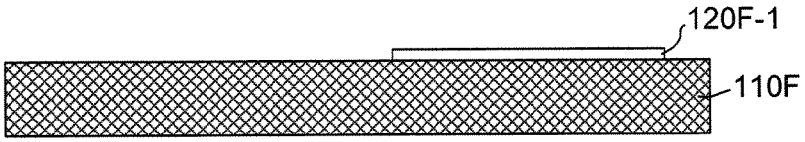
FIGS. 7(A), 7(B), 7(C), 7(D) and 7(E) are cross-sectional side views showing a transient electronic device produced in accordance with another embodiment of the present invention.
Figure 7B:
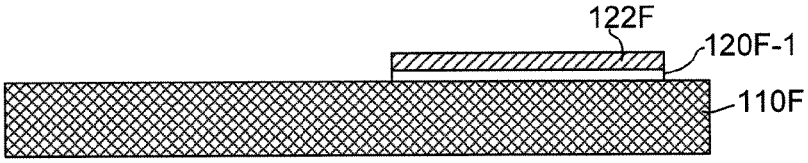
Figure 7C:
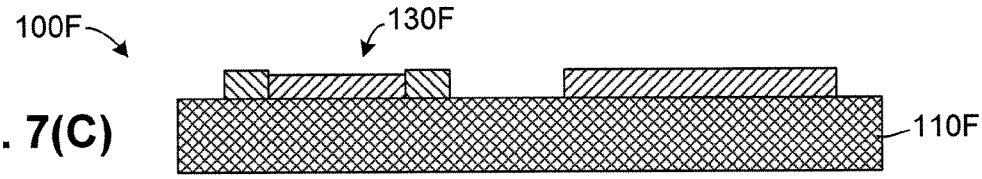
Figure 7D:
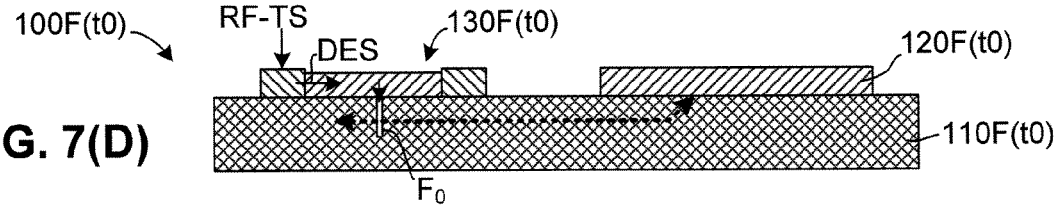
Figure 7E:
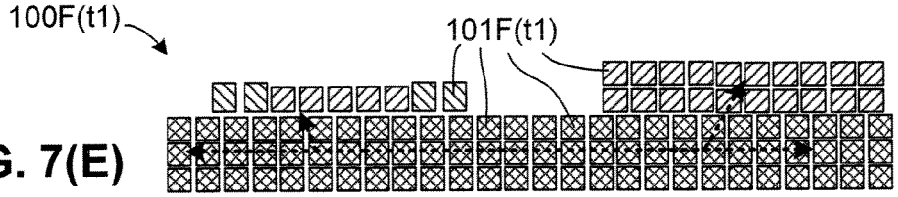

FIGS. 7(A) to 7(C) depict the fabrication and actuation of a transient electronic device 100F according to another exemplary embodiment of the present invention in which a thin-film polysilicon and/or amorphous silicon proxy is used to form electronic elements directly on a stressed substrate 100F. FIG. 7(A) depicts a stressed substrate 110F produced in accordance with any of the methodologies mentioned above with a base functional layer 120F (e.g., polycrystalline or amorphous silicon) formed thereon, FIG. 7(B) depicts the subsequent generation of electronic elements 122 in and on base functional layer 120E-1 by way of existing large area electronic ink-jet print processes, and FIG. 7(C) depicts the subsequent generation of a triggering mechanism 130F according to any of the embodiments mentioned above, thereby completing device 100F. FIGS. 7(D) and 7(E) show the subsequent controlled destruction (disaggregation) of device 100F, with FIG. 7(D) depicting device 100F(t0) during the transmission of trigger signal RF-TS to triggering mechanism 130F, which in turn generates an initial fracture $F_0$ in stressed substrate 110F according to one of the mechanisms mentioned above, and FIG. 7(E) depicting the subsequent powderized device 100F(t1) caused by the propagation of fractures throughout the various structures, thereby forming particles 101F (t1). This embodiment may be useful, for example, if for some reason the single-crystal approach fails. That is, thin film circuitry 122F represents a way to reach near-COTS-level performance with stressed substrates 110F. If processed correctly, thin film silicon layer 120F forms a bond to stressed substrate 110F that is similar to that of the stressed substrate material (e.g., glass). Furthermore, polysilicon and amorphous silicon are weaker than single-crystal silicon, and existing thin-film printing processes allow very thin layers to be formed and processed as the functional materials directly on the stressed substrate (rather than requiring a thicker single-crystal silicon substrate as support between the transient substrate and the functional materials). For these reasons, this approach presents a relatively low risk path to demonstrating silicon circuit proxies on stressed substrates. However, there are challenges associated with this approach as well. For example, there are multiple handling and processing steps that will expose the substrates to stresses and thermal gradients that could inadvertently trigger fragmentation, so custom processing may need to be developed.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A transient electronic device comprising:

a stressed substrate including at least one tensile stress layer having a residual tensile stress and at least one compressive stress layer having a residual compressive stress and being operably integrally connected to the at least one tensile stress layer such that *the* residual tensile and compressive stresses are self-equilibrating; and a trigger mechanism attached to the stressed substrate and [including means for generating] *configured to generate* an initial fracture in said stressed substrate, wherein said residual tensile and compressive stresses are sufficient to generate secondary fractures in response to said initial fracture that propagate [throughout] *through* said stressed substrate[, whereby said stressed substrate is powderized].

2. The transient electronic device of claim 1, further comprising a functional layer including one or more electronic elements, wherein the functional layer is bonded to the stressed substrate such that the secondary fractures propagate into said functional layer[, whereby said functional layer is powderized substantially simultaneously with said stressed substrate].

3. The transient electronic device of claim 2, wherein the functional [substrate] layer comprises silicon, and wherein the one or more electronic elements are integrally fabricated on the functional layer.

4. The transient electronic device of claim 1, wherein said stressed substrate further comprises a central, substantially unstressed layer.

5. The transient electronic device of claim 1, wherein said trigger mechanism [comprises one of means for applying resistive heating to] *is configured to heat* said stressed substrate, [means for initiating] *initiate* a chemical reaction in said stressed substrate, [and means for applying] *or apply* a mechanical pressure to said stressed [stressed] substrate *to generate the initial fracture*.

6. The transient electronic device of claim 2, wherein at least one of said functional layer and said substrate comprises a plurality of patterned fracture features formed such that[, when said substrate is powderized by release of said potential energy,] said substrate fractures along said plurality of patterned fracture features *in response to the initial fracture*.

7. The transient electronic device of claim 2, wherein said functional layer comprises one or more IC chips attached to the stressed substrate layer such that said IC chips [are powderized upon release of the potential energy] *fracture in response to the initial fracture*.

8. The transient electronic device of claim 7, wherein said IC chips are attached to the stressed *substrate* layer by one of a sealing glass and an anodic bond.

9. The transient electronic device of claim 1, wherein said functional layer comprises one or more thin-film electronic elements disposed directly on said stressed substrate.

10. A method for manufacturing a transient electronic device comprising:

forming a stressed substrate including at least one tensile stress layer having a residual tensile stress and at least one compressive stress layer having a residual compressive stress and being operably integrally connected to the at least one tensile stress layer such that residual tensile and compressive stresses are self-equilibrating; and disposing a trigger mechanism *configured to generate an initial fracture in the stressed substrate* and one or more electronic elements on the stressed substrate.

11. The method of claim 10, wherein forming stressed substrate comprises depositing one or more substrate materials while varying applied process conditions such that the deposited substrate material forms a plurality of layer portions collectively forming a stress gradient.

12. The method of claim 11, wherein forming *the* stressed substrate comprises depositing said one or more substrate materials onto a sacrificial structure and then removing said [one or more] sacrificial structure.

13. The method of claim 11, wherein forming stressed substrate comprises depositing said one or more substrate materials onto a core substrate.

14. The method of claim 10, wherein forming stressed substrate comprises subjecting a core substrate to one of an ion-exchange tempering treatment, a chemical treatment and a thermal treatment.

15. The method of claim 10, wherein disposing said one or more electronic elements comprises fabricating said one or more electronic elements on a functional substrate and then attaching said functional substrate to said stressed substrate.

16. The method of claim 15, wherein fabricating said one or more electronic elements comprises forming said one or more electronic elements using a photolithographic semiconductor fabrication process flow.

17. The method of claim 15, wherein attaching said functional substrate to said stressed substrate comprises using one of a sealing glass and an anodic bond.

18. The method of claim 15, further comprising forming a plurality of patterned fracture features in said functional substrate.

19. The method of claim 10, wherein disposing said one or more electronic elements comprises forming said one or more electronic elements directly on the stressed substrate.

20. The method of claim 19, wherein forming said one or more electronic elements directly on the stressed substrate comprises printing one or more thin film electronic elements on the stressed substrate.

*21. A method comprising:*

*actuating a trigger mechanism attached to a stressed substrate, the stressed substrate including at least one tensile stress layer having a residual tensile stress and at least one compressive stress layer having a residual compressive stress and being operably integrally connected to the at least one tensile stress layer such that the residual tensile and compressive stresses are self-equilibrating; and*

*generating an initial fracture in said stressed substrate in response to actuating the trigger mechanism, wherein the residual tensile and compressive stresses of the stressed substrate are sufficient to generate secondary fractures in response to the initial fracture, the secondary fractures propagating through the stressed substrate.*

*22. The method of claim 21, further comprising receiving a trigger signal, wherein actuating the trigger mechanism occurs in response to receiving the trigger signal.*

*23. The method of claim 22, wherein receiving the trigger signal comprises receiving a current pulse or a radio frequency signal.*

*24. The method of claim 21, wherein generating the initial fracture comprises heating the stressed substrate, initiating a chemical reaction in the stressed substrate, or applying mechanical pressure to the stressed substrate.*

*25. The method of claim 21, wherein the secondary fractures that propagate through the stressed substrate break a functional layer bonded to the stressed substrate.*

* * * * *